United States Patent
Yoshitake et al.

(10) Patent No.: US 6,602,651 B1
(45) Date of Patent: Aug. 5, 2003

(54) WATER-BASED SOLDER RESIST COMPOSITION

(75) Inventors: Junya Yoshitake, Hiratsuka (JP); Tetsuo Ogawa, Hiratsuka (JP); Kenji Seko, Yokosuka (JP); Jun Akui, Hiratsuka (JP); Satoru Furusawa, Hiratsuka (JP); Yutaka Yoshikawa, Kawasaki (JP)

(73) Assignee: Kansai Paint Co., Ltd., Amagasaki (JP)

( * ) Notice: Subject to any disclaimer, the term of this patent is extended or adjusted under 35 U.S.C. 154(b) by 0 days.

(21) Appl. No.: 09/743,181

(22) PCT Filed: Jul. 6, 1999

(86) PCT No.: PCT/JP99/03647

§ 371 (c)(1),
(2), (4) Date: Jan. 5, 2001

(87) PCT Pub. No.: WO00/02091

PCT Pub. Date: Jan. 13, 2000

(30) Foreign Application Priority Data

Jul. 7, 1998 (JP) .......................................... 10-191111

(51) Int. Cl.$^7$ .......................... G03F 7/027; G03F 7/038; C08L 61/21; C08L 63/00; C08L 33/26
(52) U.S. Cl. .......................... 430/280.1; 522/84; 522/85; 522/86; 522/78
(58) Field of Search .......................... 430/280.1; 522/84, 522/85, 86, 78

(56) References Cited

U.S. PATENT DOCUMENTS

| | | | | |
|---|---|---|---|---|
| 2,760,863 A | * | 8/1956 | Plambeck, Jr. | 430/281.1 |
| 4,054,683 A | * | 10/1977 | Gruber | 427/53 |
| 4,877,714 A | | 10/1989 | Tsunoda et al. | 430/270.1 |
| 5,045,435 A | | 9/1991 | Adams et al. | 430/288.1 |
| 5,501,942 A | | 3/1996 | Salvin et al. | 430/280.1 |
| 5,691,006 A | | 11/1997 | Salvin et al. | 427/510 |
| 5,712,346 A | | 1/1998 | Lee | 525/288 |
| 5,736,298 A | | 4/1998 | Koshimura et al. | 430/287.1 |
| 5,925,499 A | * | 7/1999 | Hernandez et al. | 430/280.1 |

FOREIGN PATENT DOCUMENTS

| | | |
|---|---|---|
| JP | 59-91171 | 5/1984 |
| JP | 60-79079 | 5/1985 |
| JP | 63-251416 | 10/1988 |
| JP | 64-88538 | 4/1989 |
| JP | 4-294352 | 10/1992 |
| JP | 5-140251 | 6/1993 |
| JP | 6-93221 | 4/1994 |
| JP | 7-56337 | 3/1995 |
| JP | 7-159988 | 6/1995 |
| JP | 7-261385 | 10/1995 |
| JP | 8-335768 | 12/1996 |

* cited by examiner

*Primary Examiner*—Cynthia Hamilton
(74) *Attorney, Agent, or Firm*—Armstrong, Westerman & Hattori, LLP

(57) ABSTRACT

The present invention provides an aqueous solder resist composition comprising:

(a) A water-soluble or water-dispersible, photopolymerizable resin containing at least one polymerizable unsaturated group and at least one carboxyl group, the carboxyl group being neutralized with an amine compound, (b) a photoinitiator, (c) an amino resin, and (d) a low reactivity epoxy compound free of an epoxy group represented by the formula

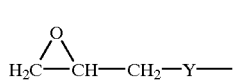

(1)

wherein Y is oxygen or nitrogen.

12 Claims, No Drawings

WATER-BASED SOLDER RESIST COMPOSITION

TECHNICAL FIELD

The present invention relates to novel aqueous solder resist compositions.

BACKGROUND ART

In production of printed circuit boards, photographic methods have been widely employed to form patterns.

For use in the photographic methods, dilute alkali-developable or water-developable solder resists are preferable to organic solvent-developable solder resists, because they are less likely to cause problems such as harm to the human body, environmental pollution and fire. Accordingly, there have been proposed dilute alkali-developable solder resists prepared using, for example, carboxyl-containing resins.

For instance, Japanese Unexamined Patent Publication No. 1986-243869 discloses a photocurable, thermosetting resist ink composition comprising an active energy radiation-curable resin, a photoinitiator, a diluent and an epoxy compound, wherein the active energy radiation-curable resin is a resin obtained by reaction of a novolak epoxy compound with an unsaturated monocarboxylic acid followed by addition of a polybasic acid anhydride to hydroxyl groups produced. However, the composition is not dilutable with water, and therefore needs to be diluted a large amount of organic solvent when used for spray coating or curtain coating. Thus, the composition has drawbacks such as poor application workability, polluting properties, fire hazard and the like.

Japanese Unexamined Patent Publication No. 1994-324490 discloses a photocurable, thermosetting resist ink composition comprising an unsaturated group-containing polycarboxylic acid resin, a photoinitiator, a diluent and a curing component (epoxy compound, melamine derivative or the like), wherein the unsaturated group-containing polycarboxylic acid resin is a resin obtained by addition of a polybasic acid anhydride to hydroxyl groups of a reaction product of a polyepoxy compound, an unsaturated monocarboxylic acid and a polyhydroxyl-containing monocarboxylic acid compound. The disclosed composition has satisfactory performance characteristics as a solder resist. However, the composition is disadvantageous in that it is of two-pack type which requires admixing of the curing component at the time of use. Further, the composition has a short pot life of several hours to a day after admixing of the curing component, and possesses the above drawbacks involved in the dilution with a large amount of organic solvent.

On the other hand, Japanese Unexamined Patent Publication No. 1993-202330 discloses, as a water-dilutable solder resist composition, a photocurable, thermosetting, aqueous solder resist ink composition comprising a photosensitive resin having an ethylenically unsaturated group and a carboxyl group neutralized with an amine compound, a photopolymerizable monomer, a photoinitiator, an amino resin and a diluent.

This aqueous composition is disadvantageous in that, if the composition contains an epoxy compound, it undergoes crosslinking and curing owing to the epoxy resin when heated in the drying step. As a result, the composition produces undeveloped portions when exposed and developed, showing poor developability. The composition is therefore heat-cured only with an amino resin without an epoxy compound, so that it does not sufficiently crosslinked. Further, the heat-cured film contains residual carboxyl groups. Thus, the solder resist film formed from the composition is not capable of withstanding the gold plating process which involves exposure to a high-temperature alkaline aqueous solution.

DISCLOSURE OF THE INVENTION

An object of the present invention is to provide a novel aqueous solder resist composition free from the above problems of the prior art.

Another object of the present invention is to provide a novel aqueous solder resist composition which is excellent in storage stability, dilutable with water, developable with water or a dilute aqueous alkali solution, free from decrease in developability, and capable of forming a resist film excellent in chemical resistance, heat resistance, electrolytic corrosion resistance and like properties.

Further objects and features of the present invention will be apparent from the following description.

The present invention provides an aqueous solder resist composition comprising (a) a water-soluble or water-dispersible, photopolymerizable resin containing at least one polymerizable unsaturated group and at least one carboxyl group, the carboxyl group being neutralized with an amine compound;

(b) a photoinitiator;

(c) an amino resin; and (d) a low reactivity epoxy compound free of an epoxy group represented by the formula

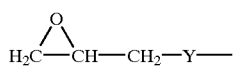 (1)

wherein Y is oxygen or nitrogen.

The present inventors conducted extensive research to obtain an aqueous solder resist composition free from the drawbacks of the prior art. As a result, they found that the above composition comprising a photopolymerizable resin, a photoinitiator, an amino resin and the above-specified low reactivity epoxy compound, is excellent in storage stability, dilutable with water, unlikely to undergo curing in the drying process and therefore unliable to decrease in developability, and developable with water or a dilute aqueous alkali solution. The present inventors also found that when the composition is heated after development, a film can be formed in which the photopolymerizable resin, amino resin and epoxy resin are highly crosslinked with one another by the reaction, and that the crosslinked film is excellent in chemical resistance, heat resistance, electrolytic corrosion resistance and other properties.

The present invention has been accomplished based on these novel findings.

The present invention will be described below in further detail.

The aqueous solder resist composition of the invention is photocurable and thermosetting, dilutable with water, and developable with water or a dilute aqueous alkali solution. The composition is preferably usable for, for example, a printed circuit board.

The photopolymerizable resin (a) for use in the aqueous resist composition of the invention is, for example, a resin obtained by neutralizing, with an amine compound, a polymerizable unsaturated group- and carboxyl-containing resin selected from the following resins (1) to (6). As used herein, "polymerizable unsaturated group" means a group capable of causing radical polymerization reaction upon exposure to active energy radiation. Examples of such groups include acryloyl, methacryloyl, vinyl, styryl and vinyl ether.

(1) A polymerizable resin prepared by addition reaction of a compound containing polymerizable unsaturated group(s) and either glycidyl group(s) or alicyclic epoxy group(s) with a carboxyl-containing acrylic resin. The carboxyl-containing acrylic resin preferably has a high acid value. A suitable acid value of the acrylic resin is about 20 to 700 mg KOH/g, more preferably about 30 to 600 mg KOH/g.

Preferred examples of the polymerizable resin (1) include resins prepared by addition reaction of a carboxyl-containing acrylic resin prepared by copolymerizing styrene, a carboxyl-containing unsaturated monomer [e.g., acrylic acid, methacrylic acid, itaconic acid, fumaric acid, maleic acid and "Aronix M-5600" (tradename of acrylic acid dimer manufactured by Toa Gosei Chemical Co.)] and other copolymerizable unsaturated monomer(s), with glycidyl (meth)acrylate, 3,4-epoxycyclohexylmethyl (meth)acrylate, or like polymerizable unsaturated group- and glycidyl-containing compound.

(2) A polymerizable resin prepared by addition reaction of a polymerizable unsaturated group- and carboxyl-containing compound with a glycidyl-containing acrylic resin, followed by addition of a dibasic acid anhydride to produced hydroxyl group(s).

Preferred examples of the polymerizable resin (2) include resins prepared by addition reaction of an acrylic resin prepared by copolymerizing a glycidyl-containing unsaturated monomer [e.g., glycidyl (meth)acrylate] and other copolymerizable unsaturated monomer(s), with (meth)acrylic acid or like polymerizable unsaturated group- and carboxyl-containing compound, followed by half-esterification of produced hydroxyl group(s) with phthalic anhydride, tetrahydrophthalic anhydride, hexahydrophthalic anhydride, succinic anhydride or like dibasic acid anhydride.

(3) A polymerizable resin prepared by addition reaction of a polymerizable unsaturated group- and carboxyl-containing compound with an epoxy resin, followed by addition of a dibasic acid anhydride to produced hydroxyl group(s).

Preferred examples of the polymerizable resin (3) include resins prepared by addition reaction of bisphenol A epoxy resin, bisphenol F epoxy resin, cresol novolac epoxy resin, aliphatic epoxy resin, alicyclic epoxy-containing resin or like epoxy resin, with (meth)acrylic acid or like polymerizable unsaturated group- and carboxyl-containing compound, followed by half-esterification of produced hydroxyl group(s) with phthalic anhydride, tetrahydric anhydride, hexahydrophthalic anhydride, succinic anhydride or like dibasic acid anhydride.

(4) A polymerizable resin prepared by addition reaction of a compound containing polymerizable unsaturated group(s) and either glycidyl group(s) or alicyclic epoxy group(s), with a carboxyl-containing polyester resin. The carboxyl-containing polyester resin preferably has a high acid value. A suitable acid value of the polyester resin is about 20 to 700 mg KOH/g, preferably about 30 to 600 mg KOH/g.

Preferred examples of the polymerizable resin (4) include resins prepared by addition reaction of a carboxyl-containing polyester resin obtained by condensation of a polymerizable unsaturated group-containing dibasic acid, a polybasic acid and a polyhydric alcohol, with glycidyl (meth)acrylate, 3,4-epoxycyclohexylmethyl (meth)acrylate or like glycidyl-containing unsaturated compound. Examples of polymerizable unsaturated group-containing diabsic acids include maleic anhydride, fumaric acid and itaconic anhydride. Examples of polybasic acids include phthalic anhydride, tetrahydrophthalic anhydride, hexahydrophthalic anhydride, succinic anhydride, adipic acid and trimellitic acid. Examples of polyhydric alcohols include ethylene glycol, propylene glycol, neopentyl glycol and trimethylolpropane.

(5) A polymerizable resin prepared by addition or condensation of a polymerizable unsaturated group- and hydroxyl-containing compound to part of carboxyl groups of a carboxyl-containing polyimide.

Preferred examples of the polymerizable resin (5) include resins prepared by addition or condensation of a hydroxyalkyl (meth)acrylate to part of carboxylic anhydride or carboxyl groups of a carboxyl-containing polyimide obtained by reaction of a tetracarboxylic anhydride and a diamine. Examples of hydroxyalkyl (meth)acrylates include 2-hydroxyethyl (meth)acrylate and 2-hydroxypropyl (meth)acrylate. Examples of tetracarboxylic anhydrides include pyromellitic acid and benzophenonetetracarboxylic anhydride. Examples of diamines include 4,4'-diaminodiphenylmethane, hexamethylenediamine and diaminobenzoic acid.

(6) A polymerizable resin prepared by addition of a polymerizable unsaturated group- and hydroxyl-containing compound to isocyanate group(s) of a carboxyl- and isocyanate-containing polyurethane.

Preferred examples of the polymerizable resin (6) include resins prepared by addition of a hydroxyalkyl (meth)acrylate to isocyanate group(s) of a carboxyl- and isocyanate-containing polyurethane obtained by addition of isocyanate group(s) of an isocyanate compound to hydroxyl group(s) of a hydroxyl- and carboxyl-containing compound. Examples of hydroxyalkyl (meth)acrylates include 2-hydroxyethyl (meth)acrylate and 2-hydroxypropyl (meth)acrylate. Examples of isocyanate compounds include tolylene diisocyanate, isophorone diisocyanate and hexamethylene diisocyanate. Examples of hydroxyl- and carboxyl-containing compounds include dimethylolpropionic acid and dimethylolbutanoic acid.

It is suitable that the resins (1) to (6) have an unsaturation equivalent of 100 to 5,000, preferably 200 to 2,000. An unsaturation equivalent of less than 100 makes it difficult to synthesize the polymerizable unsaturated group- and carboxyl-containing resin. On the other hand, an unsaturation equivalent of more than 5,000 lowers the photocurability of the resulting composition. Further, it is suitable that the resins (1) to (6) have an acid value of 20 to 300 mg KOH/g, preferably 30 to 200 mg KOH/g. An acid value less than 20 mg KOH/g makes water dilution and development difficult, whereas an acid value more than 300 mg KOH/g increases the water solubility of the photocured coating, thus reducing the developer resistance of the coating.

Each of the resins (1) to (6) can be made into a water-soluble or water-dispersible resin by neutralizing part or all of the carboxyl groups in the resin with an amine compound, giving a water dilutable, photopolymerizable resin (a).

The amine compound used for neutralization may be a known compound, but primary amine compounds and secondary amine compounds are not readily usable because they are likely to cause Michael addition reaction with a unsaturated group. Accordingly, it is preferable in the invention to use a tertiary amine compound. Examples of tertiary amine compounds include, but not limited to, triethylamine, tributylamine, N-methylmorpholine, N-ethylmorpholine, dimethylethanolamine, methyldiethanolamine, triethanolamine, dimethylaminoethyl (meth)acrylate and dimethylaminopropyl (meth)acrylate.

The amount of the amine compound to be used as a neutralizing agent is usually 0.1 to 1.2 equivalents, preferably 0.2 to 1.0 equivalent, per equivalent of carboxyl group in the skeleton of the photopolymerizable resin (a). If the neutralizing agent is used in an amount of less than 0.1 equivalent, the resulting photopolymerizable resin (a) will be difficult to dilute with water. On the other hand, more than 1.2 equivalents of the neutralizing agent will inhibit heat curing with the amino resin.

The photopolymerizable resin (a) for use in the invention can be provided as a low-solvent or solvent-free resin, in the following manner: A polymerizable unsaturated group- and carboxyl-containing resin is synthesized in an organic solvent, neutralized with an amine compound and diluted with water. Then, part or whole of the organic solvent is removed by reducing the pressure in the reaction vessel using a vacuum pump.

The photoinitiator (b) for use in the composition of the invention may be a conventional one. Examples of photoinitiators include benzoin, benzoin methyl ether, benzoin ethyl ether, benzoin isobutyl ether, diethoxyacetophenone, 2-hydroxy-2-methyl-1-phenylpropane-1-one, benzyl dimethyl ketal, 1-hydroxycyclohexylphenyl ketone, 2-methyl-2-morpholino(4-thiomethylphenyl)propane-1-one, 2-benzyl-2-dimethylamino-1-(4-morpholinophenyl)-butanone, 2,4,6-trimethylbenzoyldiphenylphosphine oxide, 2,4,6-trimethylbenzoylphenylethoxyphosphine oxide, benzophenone, methyl o-benzoylbenzoate, hydroxybenzophenone, 2-isopropylthioxanthone, 2,4-dimethylthioxanthone, 2,4-diethylthioxanthone, 2,4-dichlorothioxanthone, 2,4,6-tris(trichloromethyl)-S-triazine, 2-methyl-4,6-bis(trichloro)-S-triazine and 2-(4-methoxyphenyl)-4,6-bis(trichloromethyl)-S-triazine.

The above photoinitiators can be used either singly or in combination, as the photoinitiator (b). The amount to be used is 0.1 to 10 parts by weight per 100 parts by weight of the photopolymerizable resin (a).

A photosensitizer can be used in combination with the photoinitiator (b), to promote the photopolymerization reaction initiated by the photoinitiator. Examples of usable photosensitizers include methyl 4-dimethylaminobenzoate, ethyl 4-dimethylaminobenzoate, isoamyl 4-dimethylaminobenzoate, (2-dimethylamino)ethyl benzoate, Michler's ketone, 4,4'-diethylaminobenzophenone and like aromatic tertiary amine photosensitizers; triphenylphosphine and like alkylphosphine photosensitizers; and β-thiodiglycol and like thioether photosensitizers. These photosensitizers can be used either singly or in combination. The amount to be used is 0.1 to 10 parts by weight per 100 parts by weight of the photopolymerizable resin (a).

The amino resin (c) for use in the composition of the invention may be, for example, a melamine formaldehyde resin, a guanamine formaldehyde resin, a urea formaldehyde resin, a polymer or copolymer of N-methylol (meth) acrylamide or an alkyl ether thereof.

Commercial products (tradenames) of amino resins usable as the resin (c) are, for example, "Nikalac MW-30", "Nikalac MW-30M", "Nikalac MW-22", "Nikalac MW-22A", "Nikalac MW-11" and "Nikalac MX-750", all manufactured by Sanwa Chemical Co., Ltd., "Cymel 300", "Cymel 301", "Cymel 303" and "Cymel 350", all manufactured by Mitsui Cyanamid Co., and like methylated melamine resins; "Nikalac MX-40" and "Nikalac MX-470", both manufactured by Sanwa Chemical Co., Ltd., "Cymel 232", "Cymel 235", "Cymel 236", "Cymel 238" and "Cymel 266", all manufactured by Mitsui Cyanamid Co., and like mixed alkylated melamine resins; "Cymel 325", "Cymel 327", "Cymel 701" and "Cymel XV-514", all manufactured by Mitsui Cyanamid Co., and like imino-containing melamine resins; "Nikalac BL-60" and "Nikalac BX-4000", both manufactured by Sanwa Chemical Co., Ltd., and like benzoguanamine resins; and "Delamine CTU-100" manufactured by Fuji Kasei Kogyo Co., Ltd., and like alkylated spiroguanamine resins; and "Nikalac MX-302" manufactured by Sanwa Chemical Co., Ltd. and like unsaturated group-containing amino resins.

The above amino resins can be used either singly or in combination, as the amino resin (c). The amount to be used is usually 5 to 40 parts by weight, preferably 10 to 30 parts by weight, per 100 parts by weight of the photopolymerizable resin (a). If the amount is less than 5 parts by weight, the adhesion and soldering heat resistance of the coating will decrease. On the other hand, if the amount is over 40 parts by weight, the coating before exposure will have tackiness and adhere to a photomask film during exposure. Therefore, amounts outside the above range are not preferable.

The low reactivity epoxy compound (d) for use in the composition of the invention contains selected epoxy group (s) having relatively low reactivity, to inhibit the resist composition from causing crosslinking reaction during the drying process before exposure, and thereby prevent decrease in developability, and to improve the storage stability of the composition.

The low reactivity epoxy compound (d) is free of a high reactivity epoxy group represented by the formula

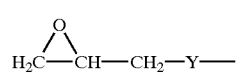

(1)

wherein Y is oxygen or nitrogen.

Specific examples of the low reactivity epoxy compound (d) include the following:

(1) A compound containing alkyl glycidyl group(s) represented by the formula

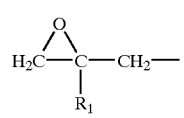

(2)

wherein $R_1$ is $C_{1-10}$ alkyl, such as methylglycidyl methacrylate or a polymer or copolymer thereof. In the alkyl glycidyl group(s) of the formula (2), $R_1$ is preferably methyl.

(2) A compound containing alicyclic epoxy group(s) represented by the formula

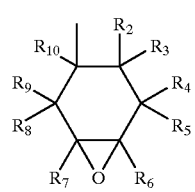

(3)

wherein $R_2$ to $R_{10}$ are the same or different and each are hydrogen or $C_{1-10}$ alkyl. In the alicyclic epoxy group of the formula (3), $R_2$ to $R_{10}$ are each preferably hydrogen or methyl.

Commercial products (tradenames) of the above alicyclic epoxy-containing compound are, for example, "Celloxide 2000", "Celloxide 3000", "Celloxide 2021", "Celloxide 2021P", "Celloxide 2080", "Celloxide 2081", "Celloxide 2083", "Celloxide 2085", "Epolead GT300", "Epolead GT301", "Epolead GT302", "Epolead GT400", "Epolead GT401", "Epolead GT403", "ETHB", "Epolead HD302", "Cyclomer A200" and (co)polymers thereof, "Cyclomer M100" and (co)polymers thereof, and "Cyclomer M101" and (co)polymers thereof, all manufactured by Daicel Chemical Industries, Ltd.; and "ERL 4289" and "ERL 4299", both manufactured by Union Carbide Corp.

(3) A compound containing epoxy group(s) represented by the formula

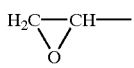 (4)

which are each directly bonded to a carbon atom of an aliphatic hydrocarbon ring. The aliphatic hydrocarbon ring preferably has 3 to 10 carbon atoms, more preferably 5 to 6 carbon atoms, and may have a hydroxyl group.

Preferred as the compound containing aliphatic hydrocarbon ring(s) having epoxy group(s) of the formula (4) bonded thereto is a polyepoxide having at least two of the hydrocarbon rings, and a weight average molecular weight of 340 to 15,000, preferably 340 to 7,000, more preferably 360 to 3,000.

Specific examples of such polyepoxides include a compound represented by the formula

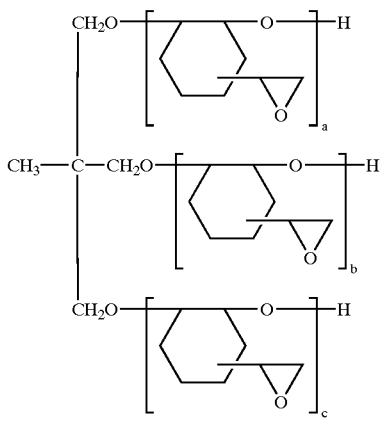 (5)

wherein a+b+c is 10 to 20; and a compound represented by the formula

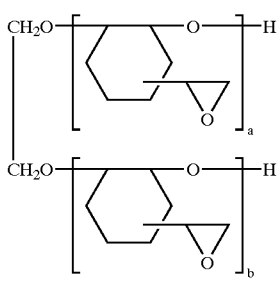 (6)

wherein a+b is 10 to 15.

A commercial product (tradename) of the compound of the formula (5) is, for example, "EHPE 3150" manufactured by Daicel Chemical Industries, Ltd.; and a commercial product (tradename) of the compound of the formula (6) is, for example, "EHPE 1150" manufactured by Daicel Chemical Industries, Ltd.

(4) An epoxy compound prepared by epoxidizing an unsaturated fatty acid represented by the following formula, or a derivative thereof:

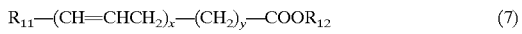

$$R_{11}-(CH=CHCH_2)_x-(CH_2)_y-COOR_{12} \tag{7}$$

wherein $R_{11}$ is hydrogen or $C_{1-10}$ alkyl, $R_{12}$ is hydrogen, $C_{1-10}$ alkyl, aryl, alkenyl, (meth)acryloyl or alkoxysilyl; x and y are each an integer of 1 to 20; and the x group(s) and y group(s) may be bonded to one another in an arbitrary order. Preferred examples of this compound include epoxidized soybean oil and epoxidized linseed oil.

Commercial products (tradenames) of the epoxy compound are, for example, "Epolead D-100", "EDHA 70", "Daimac S-300K" and "Daimac L-500", all manufactured by Daicel Chemical Industries, Ltd.

(5) An epoxy compound prepared by epoxidizing an unsaturated fatty acid derivative represented by the formula

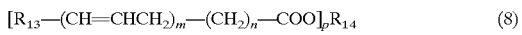

$$[R_{13}-(CH=CHCH_2)_m-(CH_2)_n-COO]_pR_{14} \tag{8}$$

wherein $R_{13}$ is $C_{1-10}$ alkyl; $R_{14}$ is a polyhydric alcohol residue having a valence of p; p is an integer of 2 to 100; m and n are each an integer of 1 to 20, and the m group(s) and n group(s) may be bonded to one another in an arbitrary order.

Commercial products (tradenames) of the epoxy compound are, for example, "Epolead D-200DH", "Epolead D-202E", "Epolead D-204P", "Epolead D-210P" and "Epolead D-210L", all manufactured by Daicel Chemical Industries, Ltd.

(6) An epoxidated polybutadiene. Commercial products (tradenames) of epoxydized polybutadienes are, for example, "Epolead PB3600" and "Epolead PB4700", both manufactured by Daicel Chemical Industries, Ltd., and "Epodyne PB-2000" manufactured by Resinas Kasei K.K.

(7) A compound represented by the formula

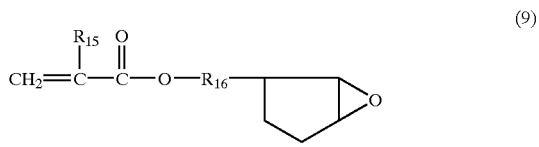 (9)

wherein $R_{15}$ is hydrogen or methyl and $R_{16}$ is $C_{1-10}$ alkylene, or a polymer or copolymer thereof.

(8) A compound represented by the formula

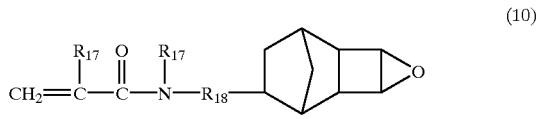 (10)

wherein $R_{17}$ is hydrogen or methyl and $R_{18}$ is $C_{1-10}$ alkylene, or a polymer or copolymer thereof.

(9) A compound represented by the formula

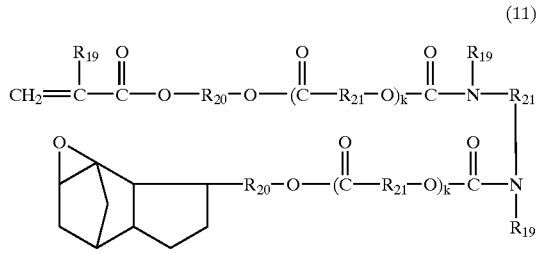

(11)

wherein $R_{19}$ is hydrogen or methyl, $R_{20}$ is $C_{1-10}$ alkylene, $R_{21}$ is $C_{1-10}$ hydrocarbon and k is 0 or an integer of 1 to 10; or a polymer or copolymer thereof.

The above low reactivity epoxy compounds may be used either singly or in combination, as the compound (d). The compound is used in an amount such that it contains 0.3 to 3.0 equivalents, preferably 0.8 to 1.2 equivalents, of epoxy groups per equivalent of carboxyl group of the photopolymerizable resin (a). If the amount of epoxy groups is less than 0.3 equivalent, the resist film will be low in adhesion, soldering heat resistance, chemical resistance, and other properties. On the other hand, if the amount of epoxy groups is over 3.0 equivalents, tackiness will be produced, hence undesirable.

The solder resist composition of the invention comprising the essential ingredients (a) to (d) may further contain a polymerizable unsaturated group-containing resin other than the photopolymerizable resin (a), a polymerizable unsaturated monomer and the like, to improve properties such as photocurability and mechanical strength of the cured film. These optional ingredients can be used in an amount not greater than 100 parts by weight per 100 parts by weight of the photopolymerizable resin (a) to suitably adjust the film properties.

Usable as the optional polymerizable unsaturated group-containing resins include, for example, resins obtained by condensation of a polyester with a (meth)acrylic acid, unsaturated group-containing polyurethane resins, unsaturated group-containing epoxy resins, unsaturated group-containing phosphorous epoxy resins, unsaturated group-containing acrylic resins, unsaturated group-containing silicone resins and unsaturated group-containing melamine resins.

Usable polymerizable unsaturated group-containing monomers include, for example, monofunctional polymerizable monomers such as styrene, methyl (meth)acrylate, ethyl (.meth)acrylate, butyl (meth)acrylate, 2-ethylhexyl (meth)acrylate, lauryl (meth)acrylate, cyclohexyl (meth)acrylate, cyclohexenyl (meth)acrylate, 2-hydroxyethyl (meth)acrylate, hydroxypropyl (meth)acrylate, tetrahydrofurfuryl (meth)acrylate, ε-caprolactone-modified tetrahydrofurfuryl (meth)acrylate, phenoxyethyl (meth)acrylate, phenoxypolyethylene glycol (meth)acrylate, dicyclopentenyl (meth)acrylate, dicyclopentenyloxyethyl (meth)acrylate, isobornyl (meth)acrylate, benzyl (meth)acrylate, ε-caprolactone-modified hydroxyethyl (meth)acrylate, polyethylene glycol mono(meth)acrylate, polypropylene glycol mono(meth)acrylate, 2-hydroxy-3-phenoxypropyl (meth)acrylate, 2-hydroxy-3-butoxypropyl (meth)acrylate, phthalic acid monohydroxyethyl (meth)acrylate, "Aronix M110" (tradename of p-cumylphenol ethylene oxide-modified acrylate manufactured by Toa Gosei Chemical Co.), N-methylol (meth)acrylamide, N-methylol (meth)acrylamide butyl ether, acryloylmorpholine, dimethylaminoethyl (meth)acrylate and N-vinyl-2-pyrolidone.

Also usable are bifunctional polymerizable monomers such as ethylene glycol di(meth)acrylate, diethylene glycol di(meth)acrylate, polyethylene glycol di(meth)acrylate, propylene glycol di(meth)acrylate, dipropylene glycol di(meth)acrylate, polypropylene glycol di(meth)acrylate, neopentyl glycol di(meth)acrylate, 1,4-butanediol di(meth)acrylate, 1,6-hexanediol di(meth)acrylate, bisphenol A ethylene oxide-modified di(meth)acrylate, bisphenol A propylene oxide-modified di(meth)acrylate, 2-hydroxy-1-acryloxy-3-methacryloxypropane, tricyclodecane dimethanol di(meth)acrylate, di(meth)acryloyloxyethyl acid phosphate, commercial products available under the tradenames of "Kayarad HX-220", "Kayarad HX-620", "Kayarad R-604" and "Kayarad-MANDA", all from Nippon Kayaku Co., Ltd., and the like.

Also usable are tri or higher functional polymerizable monomers such as trimethylolpropane tri(meth)acrylate, trimethylolpropane ethylene oxide-modified tri(meth)acrylate, trimethylolpropane propylene oxide-modified tri(meth)acrylate, glycerin tri(meth)acrylate, glycerin ethylene oxide-modified tri(meth)acrylate, glycerin propylene oxide-modified tri(meth)acrylate, pentaerythritol tri(meth)acrylate, pentaerythritol tetra(meth)acrylate, isocyanuric acid ethylene oxide-modified triacrylate, dipentaerythritol hexa(meth)acrylate and the like.

Further, additives can be used which include coloring pigments, extender pigments, rust preventive pigments, dyes, thermoplastic resins, migration inhibitors (compounds capable of coordinating to a metal, such as acetylacetone, hydroxybenzotriazole and the like), and various other additives (such as polymerization inhibitors, leveling agents, antifoaming agents, anti-sagging agents and copper adhesion promoters) and the like.

Coloring pigments, extender pigments, rust preventive pigments and dyes conventionally employed in the ink and paint industry can be used, in an amount not greater than 300 parts by weight, preferably not greater than 200 parts by weight, per 100 parts by weight of the resin content of the composition.

Further, the solder resist composition of the invention may contain, where necessary, curing catalysts as described below.

Catalysts for heat curing include alkali metals (sodium, lithium and the like), alkaline earth metals (calcium, magnesium and the like), hydroxides of metals selected from nickel, copper, molybdenum, lead, iron, chromium, manganese, tin and cobalt, organic acid salts, chelate compounds, alkoxides and the like. Catalysts for promoting the crosslinking reaction between epoxy group(s) and carboxylic acid include ammonium salts, sulfonium salts, oxonium salts, iodonium salts, phosphonium salts, nitronium salts, nitrosonium salts, diazonium salts and like onium salts. Also, organic or inorganic acids such as sulfuric acid and sulfonic acid can be used for promoting the reaction between the amino resin and hydroxyl group(s). The curing catalyst is preferably added in an amount not greater than 10 parts by weight, more preferably 0.01 to 5 parts by weight, per 100 parts by weight of the photopolymerizable resin (a).

The aqueous resist composition of the invention is water soluble or water dispersible, and has a solid content of usually about 10 to 60 wt. %, preferably about 15 to 50 wt. %. Water is used as a medium for the composition of the invention, and where necessary, a hydrophilic solvent may be used in combination to improve the fluidity of the composition. Usable hydrophilic solvents include, for example, isopropanol, n-butanol, t-butanol, methoxyethanol, ethoxyethanol, butoxyethanol, diethylene glycol, methyl ether, dioxane, tetrahydrofuran, methoxypropanol and butyl cellosolve. The hydrophilic solvent is used preferably in an amount not greater than 100 parts by weight per 100 parts by weight of the photopolymerizable resin (a).

The resist composition of the invention thus obtained is applied to a substrate such as a printed circuit board, by a conventional method such as spray coating, roll coating, dip coating, silk screen printing or curtain coating. The coating has a thickness of usually about 5 to 50 μm, preferably about 10 to 30 μm, when cured. The applied coating is freed of organic solvent at 50 to 100° C., and then photocured by irradiation with 10 to 2,000 mJ/cm$^2$, preferably 50 to 1,000 mJ/cm$^2$ of active energy, such as ultraviolet rays, through a film bearing a pattern (photomask).

Conventional exposure apparatus for radiation of active energy can be used, which include a high pressure mercury lamp, an extra-high pressure mercury lamp, a xenon amp, a metal halide lamp and the like.

For development, water or a dilute aqueous alkali solution is sprayed on the surface of the resist coating to wash out uncured portions of the coating. Usable dilute aqueous alkali solutions are those capable of neutralizing carboxyl groups in the coating and rendering the coating water soluble, such as aqueous sodium carbonate solutions, aqueous caustic soda solutions and aqueous caustic potash solutions. For example, when an aqueous sodium carbonate solution is used, the solution has preferably a concentration of 0.1 to 5 wt. %. An aqueous sodium carbonate solution having a concentration lower than 0.1 wt. % makes the development difficult, whereas the solution having a concentration over 5 wt. % is liable to destroy the pattern portion. Thus, an aqueous sodium carbonate solutions having a concentration outside the above range is not preferable.

After photocuring and development, the coated plate is heat-treated at 120 to 180w for 10 to 60 minutes, so as to release amine from the coating and cause a reaction between carboxyl group(s) and epoxy group(s), a reaction between hydroxyl group(s) and amino resin, polymerization of residual unsaturated group(s), an addition reaction of unsaturated group(s) and hydroxyl group(s), and like reactions in the resin component, thereby forming a coating film (resist film) having a high crosslinking density. As a result, the resist film is excellent in heat resistance, chemical resistance, electrolytic corrosion resistance and other properties.

The aqueous solder resist composition of the invention has good storage stability, and free from problems of safety and hygiene, because the uncured coating is removable with water or a dilute aqueous alkali solution, which are harmless. Further, the cured film is excellent in adhesion to the substrate, heat resistance, chemical resistance, electrolytic corrosion resistance and impact resistance. Therefore, the composition of the invention can be preferably usable as a resist composition for a printed circuit board.

BEST MODE FOR CARRYING OUT THE INVENTION

The following Production Examples, Examples and Comparative Examples are provided to illustrate the present invention in further detail. In the following examples, parts and percentages are all by weight.

Production of Photopolymerizable Resin

PRODUCTION EXAMPLE 1

700 parts of propylene glycol monomethyl ether was placed in a reaction vessel equipped with a thermometer, a thermostat, a stirrer, a reflux condenser and a dropping device, and heated to 115° C. while blowing a nitrogen gas into the vessel. Then, a mixture consisting of 110 parts of n-butyl methacrylate, 300 parts of methyl methacrylate, 158 parts of styrene, 432 parts of acrylic acid and 30 parts of α,α'-azobisisobutyronitrile was added dropwise from the dropping device over a period of 3 hours. After the addition, the resulting mixture was stirred at 115° C. for 3 hours, giving a resin having an acid value of 327 mg KOH/g. Supply of nitrogen gas was stopped, and 4 parts of tetramethyl ammonium bromide, 497 parts of glycidyl methacrylate and 1 part of hydroquinone were added, to carry out reaction at 115° C. for 5 hours while blowing air into the vessel. Thus, a methacryloyl- and carboxyl-containing resin having an unsaturation equivalent of 436 and an acid value of 92 mg KOH/g was obtained.

The resin solution was cooled to room temperature. After adding 253 parts of triethylamine and 1,400 parts of deionized water in this order, a reduced pressure was maintained in the reaction vessel for 1 hour using a vacuum pump, to remove propylene glycol monomethyl ether. As a result, a resin solution A having a neutralization equivalent of 1.0 and a solid content of 48% was obtained.

PRODUCTION EXAMPLE 2

Using the same reaction vessel as in Production Example 1, a mixture consisting of 150 parts of n-butyl methacrylate, 150 parts of methyl methacrylate, 188 parts of styrene, 512 parts of glycidyl acrylate and 30 parts of α,α'-azobisisobutyronitrile was added dropwise over a period of 3 hours into 700 parts of carbitol acetate maintained at 115° C., in a nitrogen atmosphere. After the addition, the resulting mixture was stirred at 115° C. for 3 hours. Then, 4 parts of tetramethyl ammonium bromide, 288 parts of acrylic acid and 1 part of hydroquinone were added, to carry out reaction for 5 hours while blowing air into the vessel. 608 parts of tetrahydrophthalic anhydride was added to the reaction mixture, to carry out reaction for 5 hours. Thus, an acryloyl- and carboxyl-containing resin having an unsaturation equivalent of 482 and an acid value of 117 mg KOH/g was obtained.

The resin solution was cooled to room temperature. After adding 404 parts of N-methylmorpholine and 1,400 parts of deionized water in this order, a reduced pressure was maintained in the reaction vessel for 1 hour using a vacuum pump, to remove carbitol acetate. As a result, a resin solution B having a neutralization equivalent of 1.0 and a solid content of 52% was obtained.

PRODUCTION EXAMPLE 3

In a reaction vessel equipped with a thermometer, a thermostat, a stirrer and a reflux condenser tube having a water separator, a mixture consisting of 192 parts of trimellitic anhydride, 888 parts of phthalic anhydride, 730 parts of adipic acid, 416 parts of neopentyl glycol, 248 parts of ethylene glycol and 0.5 parts of dibutyltin oxide was heated from room temperature to 240° C. over a period of 4 hours. Then, 150 parts of xylene was added, and condensation reaction was carried out for 3 hours in xylene at reflux while maintaining the reaction mixture at 240° C., giving a polyester having an acid value of 231 mg KOH/g. After cooling the reaction mixture to room temperature, 1,000 parts of propylene glycol monomethyl ether, 426 parts of glycidyl methacrylate and 1 part of hydroquinone were added, to carry out a reaction at 60° C. for 5 hours while blowing air into the vessel. Thus, a methacryloyl- and carboxyl-containing resin having an unsaturation equivalent of 967 and an acid value of 129 mg KOH/g was obtained.

The resin solution was cooled to room temperature. After adding 534 parts of dimethylethanol amine and 2,000 parts of deionized water in this order, a reduced pressure was maintained in the reaction vessel for 1 hour using a vacuum pump, to remove xylene and propylene glycol monomethyl ether. As a result, a resin solution C having a neutralization equivalent of 0.9 and a solid content of 53% was obtained.

PRODUCTION EXAMPLE 4

In a reaction vessel equipped with a thermometer, a thermostat, a stirrer and a reflux condenser, 1,000 parts of "Epikoat 190S80" (tradename of a cresol novolac epoxy resin having an epoxy equivalent of 200, manufactured by Yuka Shell K.K.), 2.5 parts of hydroquinone and 10 parts of tetraethylammonium bromide were dissolved in 1,000 parts of carbitol acetate. The solution was heated to 100° C., and 360 parts of acrylic acid was added dropwise over a period of 3 hours while blowing air into the vessel. After the addition, the resulting mixture was stirred at 100° C. for 5 hours. To the reaction mixture was added 770 parts of hexahydrophthalic anhydride, followed by 5-hour reaction. Thus, an acryloyl- and carboxyl-containing resin having an unsaturation equivalent of 426 and an acid value of 132 mg KOH/g was obtained.

The resin solution was cooled to room temperature. After adding 715 parts of dimethylaminoethyl acrylate and 2,000 parts of deionized water in this order, a reduced pressure was maintained in the reaction vessel for 1 hour using a vacuum pump, to remove carbitol acetate. As a result, a resin solution D having a neutralization equivalent of 1.0 and a solid content of 44% was obtained.

PRODUCTION EXAMPLE 5

In a flask equipped with a thermometer, a thermostat, a stirrer and a reflux condenser tube having a water separator, 646 parts of N-methylpyrrolidone and 142 parts of trimethylhexamethylene diamine were mixed. Then, 230 parts of pyromellitic acid was added, and the resulting mixture was heated to 160° C. over 3 hours. Subsequently, 70 g of toluene was added and refluxed at 160° C. to carry out dehydration reaction for 5 hours. The reaction mixture was then heated to 200° C. to remove toluene.

The reaction mixture was cooled to 60° C. One part of hydroquinone and 42 parts of glycidyl methacrylate were added to carry out a reaction for 5 hours while blowing air into the vessel. Thus, a methacryloyl- and carboxyl-containing resin having an unsaturated equivalent of 1,400 and an acid value of 41 mg KOH/g was obtained.

The resin solution was cooled to room temperature, and 45 parts of triethanolamine was added thereto, followed by stirring. As a result, a resin solution E having a neutralization equivalent of 1.0 and a solid content of 37% was obtained.

EXAMPLE 1

Photopolymerizable resin solution A of

| | |
|---|---|
| Production Example 1 | 208 parts |
| "Irgacure 907" | 5 parts |
| "Nikalac MW-30M" | 20 parts |
| "Epolead GT 300" | 20 parts |
| Phthalocyanine green | 0.5 part |
| Talc | 50 parts |

The above ingredients were blended together and diluted with deionized water to 40%, giving a solder resist composition according to the invention.

Of the ingredients, "Irgacure 907n (tradename) is an aminoalkylphenone photoinitiator having a solid content of 100%, manufactured by Ciba-Geigy Corp.; "Nikalac MW-30M" (tradename) is a methylated melamine resin having a solid content of 100%, manufactured by Sanwa Chemical Co., Ltd.; and "Epolead GT300" (tradename) is an alicyclic epoxy resin having a solid content of 100%, manufactured by Daicel Chemical Industries, Ltd.

The obtained composition was coated on a glass epoxy printed circuit board (1.6 mm thick) having a copper thickness of 35 μm using an electrostatic spray coating device. The applied composition was dried for 15 minutes using a hot air dryer at 80° C., giving a smooth photosensitive coating having a thickness of 30 μm. Subsequently, a negative photomask film was adhered to the coated board using a vacuum device, and the coated board was exposed to 300 mJ/cm$^2$ of energy radiation using a 10 kw extra-high pressure mercury lamp, and developed with a 1% aqueous sodium carbonate solution at 25° C. The developed coating was then baked for 30 minutes using a hot air dryer at 150", giving a solder resist film.

EXAMPLE 2

Photopolymerizable resin solution B of

| | |
|---|---|
| Production Example 2 | 100 parts |
| "Irgacure 907" | 5 parts |
| "Cymel 238" | 30 parts |

Homopolymer of methylglycidyl methacylate, having a molecular weight of about 10,000

| | |
|---|---|
| (solid content: 80%) | 10 parts |
| Phthalocyanine green | 0.5 part |
| Talc | 50 parts |

The above ingredients were blended together and diluted with deionized water to 40%, giving a solder resist composition according to the invention.

Of the ingredients, "Irgacure 907" (tradename) is as described above; and "Cymel 238" (tradename) is a methylated melamine resin having a solid content of 100%, manufactured by Mitsui Cyanamid Co.

Using the obtained composition, a solder resist film was formed in the same manner as in Example 1.

EXAMPLE 3

Photopolymerizable resin solution C of

| | |
|---|---|
| Production Example 3 | 100 parts |
| "Irgacure 907" | 5 parts |
| "Nikalac BX-4000" | 20 parts |
| "EHPE 1150" | 20 parts |
| Phthalocyanine green | 0.5 part |
| Talc | 50 parts |

The above ingredients were blended together and diluted with deionized water to 40%, giving a solder resist composition according to the invention.

Of the ingredients, "Irgacure 907" (tradename) is as described above; "Nikalac BX-4000" (tradename) is a benzoguanamine resin having a solid content of 100%, manufactured by Sanwa Chemical Co., Ltd.; and "EHPE 1150" (tradename) is a polyepoxide represented by the formula (6) and having a solid content of 100%, manufactured by Daicel Chemical Industries, Ltd.

Using the obtained composition, a solder resist film was formed in the same manner as in Example 1.

EXAMPLE 4

Photopolymerizable resin solution D of

| | |
|---|---|
| Production Example 4 | 100 parts |
| "Irgacure 907" | 5 parts |

Homopolymer of N-n-butoxymethyl acrylamide having a molecular weight of about 10,000

| | |
|---|---|
| (solid content: 80%) | 20 parts |
| "Epolead D-200 HD" | 20 parts |
| Phthalocyanine green | 0.5 part |
| Talc | 50 parts |

The above ingredients were blended together and diluted with deionized water to 40%, giving a solder resist composition according to the invention.

Of the ingredients, "Irgacure 907" (tradename) is as described above; and "Epolead D-200 HD" (tradename) is a compound prepared by epoxidizing an unsaturated fatty acid and having a solid content of 100%, manufactured by Daicel Chemical Industries, Ltd.

Using the obtained composition, a solder resist film was formed in the same manner as in Example 1.

EXAMPLE 5

Photopolymerizable resin solution E of

| | |
|---|---|
| Production Example 5 | 100 parts |
| "Irgacure 907" | 5 parts |
| "Delamine CTU-100" | 20 parts |
| "Epolead PB3600" | 20 parts |
| Phthalocyanine green | 0.5 part |
| Talc | 50 parts |

The above ingredients were blended together and diluted with deionized water to 40%, giving a solder resist composition according to the invention.

Of the ingredients, "Irgacure 907" (tradename) is as described above; "Delamine CTU-100" (tradename) is a spiroguanamine resin having a solid content of 80%, manufactured by Fuji Kasei Kogyo Co., Ltd.; and "Epolead PB3600" (tradename) is an epoxidized polybutadiene having a solid content of 100%, manufactured by Daicel Chemical Industries, Ltd.

Using the obtained composition, a solder resist film was formed in the same manner as in Example 1.

EXAMPLE 6

A solder resist composition according to the invention was prepared by following the procedure of Example 3 except for using, in place of "EHPE 1150", the same amount of "EHPE 3150".

"EHPE 3150" (tradename) is a polyepoxide represented by the formula (5) and having a solid content of 100%, manufactured by Daicel Chemical Industries, Ltd.

Using the obtained composition, a solder resist film was formed in the same manner as in Example 1.

COMPARATIVE EXAMPLE 1

A comparative solder resist composition was prepared by following the procedure of Example 1, except that "Epolead GT 300" was not used.

Using the obtained composition, a solder resist film was formed in the same manner as in Example 1.

COMPARATIVE EXAMPLE 2

A comparative solder resist composition was prepared by following the procedure of Example 2, except that "Cymel 238" was not used.

Using the obtained composition, a solder resist film was formed in the same manner as in Example 1.

COMPARATIVE EXAMPLE 3

A comparative solder resist composition was prepared by following the procedure of Example 3 except for using, in place of "EHPE1150", the same amount of "Epikoat 1009".

"Epikoat 1009" (tradename) is a bisphenol A epoxy resin having a solid content of 100%, manufactured by Yuka Shell K.K.

Using the obtained composition, a solder resist film was formed in the same manner as in Example 1.

The solder resist films obtained in Examples 1 to 6 and Comparative Examples 1 to 3 were tested for performance by the following methods.

Performance Test Methods

Developability: The resist films after exposure were developed by spraying a 1% aqueous sodium carbonate solution as a developer, at 25° C., at a spray pressure of 25 kg/cm$^2$, for 60 seconds. The resulting films were rated as follows. A: No film residue; B: Some film residue; C: Undevelopable.

Soldering heat resistance: The test pieces were treated with "Flux CF330 VH" (tradename of a rosin resin solution having a solid content of 12%, manufactured by Tamura Kaken Corp.), dried with hot air at 80° C. for 5 minutes, and submerged in a solder bath at 260° C. for 10 seconds. The process consisting of flux treatment, drying and submergence was performed three times, and thereafter adhesion of the resist films was evaluated by a test method according to JIS K 5400 8.5.2 (1990). That is, crosswise cuts were made on the resist film of each test piece to form 100 squares (each 1 mm×1 mm), and cellophane adhesive tape was closely adhered to the cut portions and then quickly torn off. The resulting films were rated according to the number of remaining squares. A: 100 squares remaining; B: 99 to 95 squares remaining; C: 94 to 50 squares remaining; D: less than 50 squares remaining.

Acid resistance: The test pieces were submerged in a 10% sulfuric acid solution at 20° C. for 1 hour, and crosswise cuts were made on the resist film of each test piece to form squares. Cellophane adhesive tape was closely adhered to the cut portions and then quickly torn off. Subsequently, the films were checked for peeling and rated on the following scale. A: No peeling of the film; B: Slight peeling of the film; C: Noticeable peeling of the film.

Alkali resistance: The test pieces were submerged in a 10% aqueous sodium hydroxide solution at 20° C. for 1 hour, and crosswise cuts were made on the resist film of each test piece to form squares. Cellophane adhesive tape was closely adhered to the cut portions and then quickly torn off. Subsequently, the resist films were checked for peeling and rated on the following scale. A: No peeling of the film; B: Slight peeling of the film; C: Noticeable peeling of the film.

Adhesion: Adhesion was measured according to the test method of JIS D 0202. That is, crosswise cuts were made on the resist films of the test pieces to form squares, and cellophane adhesive tape was closely adhered to the cut portions and then quickly torn off. Subsequently, the resist films were checked for peeling and rated on the following scale. A: No peeling of the film; B: Slight peeling of the film; C: Noticeable peeling of the film.

Insulation resistance (Ω): Test boards were prepared using Type II G-10 comb-shaped test patterns according to JIS Z 3197, and tested for insulation resistance after applying a voltage of 100 V for 1 minute.

Electrolytic corrosion resistance: Test boards were prepared using Type II G-10 comb-shaped test patterns according to JIS Z 3197. A bias voltage of 100 V DC was applied to the test boards. The resulting test boards were left to stand for 500 hours in a constant temperature and humidity chamber maintained at 40° C. and 90% RH, and checked for dendrites. Dendrites are needle-shaped crystals formed by recrystallization of precipitated copper, which cause a short circuit in the pattern. The test boards were rated as follows. A: No dendrite formed; B: A small amount of dendrites formed; C: A noticeable amount of dendrites formed.

Storage stability of the composition: The compositions were left to stand in separate sealed vessels at 20° C. for 1 month. Thereafter, change in viscosity of the compositions was measured and rated as follows. A: less than 10% change in viscosity; B: 10 to 50% change in viscosity; C: 50% or more change in viscosity.

Table 1 shows the test results.

TABLE 1

| Tested properties | Example | | | | | | Comp. Ex. | | |
|---|---|---|---|---|---|---|---|---|---|
| | 1 | 2 | 3 | 4 | 5 | 6 | 1 | 2 | 3 |
| Developability | A | A | A | A | A | A | A | A | C |
| Soldering heat resistance | A | A | A | A | A | A | B | B | A |
| Acid resistance | A | A | A | A | A | A | A | A | A |
| Alkali resistance | A | A | A | A | A | A | C | B | A |
| Adhesion | A | A | A | A | A | A | B | B | A |
| Insulation resistance (Ω) | 7E13 | 6E13 | 6E13 | 6E13 | 7E13 | 6E13 | 2E13 | 3E13 | 6E13 |
| Electrolytic corrosion resistance | A | A | A | A | A | A | C | B | A |
| Storage stability | A | A | A | A | A | A | A | A | C |

The aqueous solder resist composition of the present invention has good storage stability and is readily dilutable with water. When the composition is applied to a substrate and exposed, a resist coating is formed which has high developability and can be easily developed with water or a dilute aqueous alkali solution. The resist film, as heat-treated after development, is excellent in chemical resistance, heat resistance, electrolytic corrosion resistance and other properties.

What is claimed is:

1. An aqueous solder resist composition comprising:

(a) a water-soluble or water-dispersible, photopolymerizable resin containing at least one polymerizable unsaturated group and at least one carboxyl group, the carboxyl group being neutralized with an amine compound;

(b) a photoinitiator;

(c) an amino resin; and (d) a low reactivity epoxy compound free of an epoxy group represented by the formula

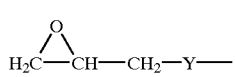

(1)

wherein Y is oxygen or nitrogen; the low reactivity epoxy compound (d) being at least one compound selected from the group consisting of the following compounds (i) and (iii) to (ix):

(i) methylglycidyl methacrylate or a polymer or a copolymer thereof;

(iii) a compound represented by the formula

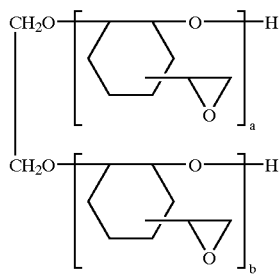

(6)

wherein a+b is 10 to 15;

(iv) an epoxy compound prepared by epoxidizing an unsaturated fatty acid represented by the following formula or a derivative thereof:

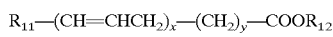

(7)

wherein $R_{11}$ is hydrogen or $C_{1-10}$ alkyl $R_{12}$ is hydrogen, $C_{1-10}$ alkyl aryl, alkenyl, (meth)acryloyol or alkoxysilyl; x and y are each an integer of 1 to 20; and the x groups and the y groups may be bonded to one another in an arbitrary order;

(v) an epoxy compound prepared by epoxidizing an unsaturated fatty acid derivative represented by the formula

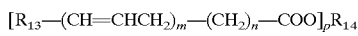

(8)

wherein $R_{13}$ is $C_{1-10}$ alkyl; $R_{14}$ is a polyhydric alcohol residue having a valence of p; p is an integer of 2 to 100; m and n are each an integer of 1 to 20; and the m groups and the n groups may be bonded to one another in an arbitrary order;

(vi) an epoxidized polybutadiene;

(vii) a compound represented by the formula

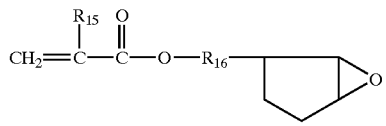

(9)

wherein $R_{15}$ is hydrogen or methyl, and $R_{16}$ is $C_{1-10}$ alkylene; or a polymer or copolymer thereof, (viii) a compound represented by the formula

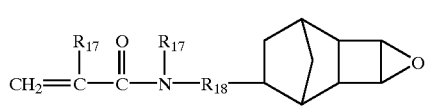

(10)

wherein $R_{17}$ is hydrogen or methyl, and $R_{18}$ is $C_{1-10}$ alkylene; or a copolymer or copolymer thereof; and (ix) a compound represented by the formula

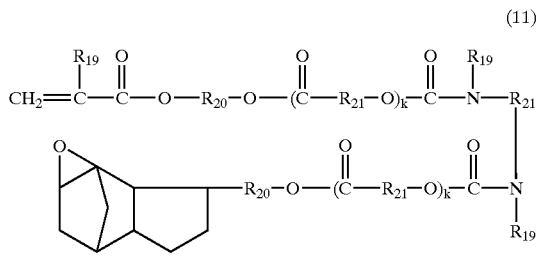

(11)

wherein $R_{19}$ is hydrogen or methyl, $R_{20}$ is $C_{1-10}$ alkylene, $R_{21}$ is a $C_{1-10}$ hydrocarbon group, and k is 0 or an integer of 1 to 10; or a polymer or copolymer thereof.

2. The composition according to claim 1, wherein the photopolymerizable resin (a) is a resin prepared by neutralizing, with an amine compound, a polymerizable unsaturated group- and carboxyl-containing resin obtained by addition reaction of a carboxyl-containing acrylic resin with a compound containing a polymerizable unsaturated group and either a glycidyl group or an alicyclic epoxy group.

3. The composition according to claim 1, wherein the photopolymerizable resin (a) is a resin prepared by neutralizing, with an amine compound, a polymerizable unsaturated group- and carboxyl-containing resin obtained by addition reaction of an epoxy resin with a polymerizable unsaturated group- and carboxyl-containing compound followed by addition of a dibasic acid anhydride to a produced hydroxyl group.

4. The composition according to claim 1, wherein the amino resin (c) is at least one member selected from the group consisting of melamine formaldehyde resins, guanamine formaldehyde resins, urea formaldehyde resins and (co)polymers of N-methylol (meth)acrylamides or alkyl ethers thereof.

5. The composition according to claim 1, which contains the photoinitiator (b) in an amount of 0.1 to 10 parts by weight per 100 parts by weight of the photopolymerizable resin (a).

6. The composition according to claim 1, which contains the amino resin (c) in an amount of 5 to 40 parts by weight per 100 parts by weight of the photopolymerizable resin (a).

7. The composition according to claim 1, wherein the amount of epoxy groups of the low reactivity epoxy compound (d) is 0.3 to 3.0 equivalents per equivalent of carboxyl group of the photopolymerizable resin (a).

8. An aqueous solder resist composition comprising:
(a) a water-soluble or water dispersible, photopolymerizable resin containing at least one polymerizable unsaturated group and at least one carboxyl group, the carboxyl group being neutralized with an amine compound;
(b) a photoinitiator;
(c) an amino resin; and
(d) a low reactivity epoxy compound free of an epoxy group represented by the formula

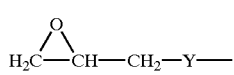

(1)

wherein Y is oxygen or nitrogen; the low reactivity epoxy compound (d) being at least one compound selected from the following compounds (i) to (ix):

(i) methylglycidyl methacrylate or a polymer or a copolymer thereof;

(ii) a compound containing an alicyclic epoxy group represented by the formula

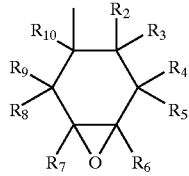

(3)

wherein $R_2$ to $R_{10}$ are the same or different and each are hydrogen or $C_{1-10}$ alkyl;

(iii) a compound represented by the formula

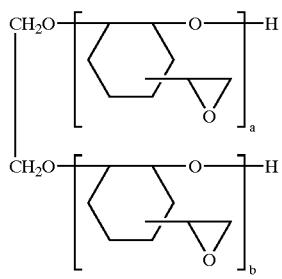

(6)

wherein a+b is 10 to 15;

(iv) an epoxy compound prepared by epoxidizing an unsaturated fatty acid represented by the following formula or a derivative thereof:

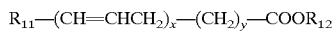

(7)

wherein $R_{11}$ is hydrogen or $C_{1-10}$ alkyl; $R_{12}$ is hydrogen, $C_{1-10}$ alkyl aryl, alkenyl, (meth)acryloyol or alkoxysilyl; x and y are each an integer of 1 to 20; and the x groups and the y groups may be bonded to one another in an arbitrary order;

(v) an epoxy compound prepared by epoxidizing an unsaturated fatty acid derivative represented by the formula

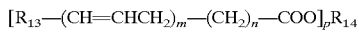

(8)

wherein $R_{13}$ is $C_{1-10}$ alkyl; $R_{14}$ is a polyhydric alcohol residue having a valence of p; p is an integer of 2 to 100; m and n are each an integer of 1 to 20; and the m groups and the n groups may be bonded to one another in an arbitrary order;

(vi) an epoxidized polybutadiene;

(vii) a compound represented by the formula

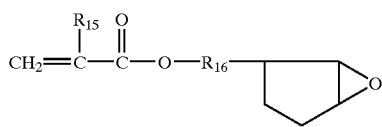

(9)

wherein $R_{15}$ is hydrogen or methyl, and $R_{16}$ is $C_{1-10}$ alkylene; or a polymer or copolymer thereof;

(viii) a compound represented by the formula

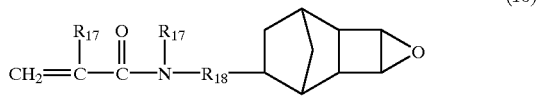

(10)

wherein $R_{17}$ is hydrogen or methyl, and $R_{18}$ is $C_{1-10}$ alkylene; or a polymer or copolymer thereof; and (ix) a compound represented by the formula

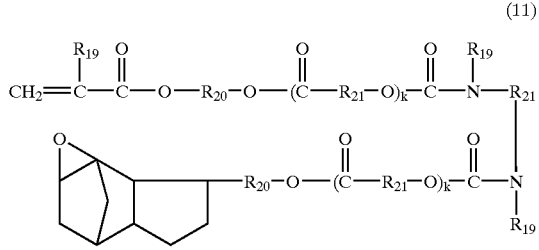

(11)

wherein $R_{19}$ is hydrogen or methyl, $R_{20}$ is $C_{1-10}$ alkylene, $R_{21}$ is a $C_{1-10}$ hydrocarbon group, and k is 0 or an integer of 1 to 10; or a polymer or copolymer thereof; and wherein the photopolymerizable resin (a) is a resin prepared by neutralizing, with an amine compound, a polymerizable unsaturated group- and carboxyl-containing resin obtained by addition reaction of an epoxy resin with a polymerizable unsaturated group- and carboxyl-containing compound followed by addition of a dibasic acid anhydride to a produced hydroxyl group.

9. The composition according to claim 8, wherein the amino resin (c) is at least one member selected from the group consisting of melamine formaldehyde resins, guanamine formaldehyde resins, urea formaldehyde resins and (co)polymers of N-methylol (meth)acrylamides or alkyl ethers thereof.

10. The composition according to claim 8, which contains the photoinitiator (b) in an amount of 0.1 to 10 parts by weight per 100 parts by weight of the photopolymerizable resin (a).

11. The composition according to claim 8, which contains the amino resin (c) in an amount of 5 to 40 parts by weight per 100 parts by weight of the photopolymerizable resin (a).

12. The composition according to claim 8, wherein the amount of epoxy groups of the low reactivity epoxy compound (d) is 0.3 to 3.0 equivalents per equivalent of carboxyl group of the photopolymerizable resin (a).

* * * * *